United States Patent
Ohbayashi et al.

(10) Patent No.: US 8,791,485 B2
(45) Date of Patent: Jul. 29, 2014

(54) LED ENCAPSULATION RESIN BODY, LED DEVICE, AND METHOD FOR MANUFACTURING LED DEVICE

(75) Inventors: Takashi Ohbayashi, Osaka (JP); Seigo Shiraishi, Osaka (JP)

(73) Assignee: Panasonic Corporation, Osaka (JP)

( * ) Notice: Subject to any disclaimer, the term of this patent is extended or adjusted under 35 U.S.C. 154(b) by 40 days.

(21) Appl. No.: 13/599,057

(22) Filed: Aug. 30, 2012

(65) Prior Publication Data

US 2012/0326197 A1    Dec. 27, 2012

Related U.S. Application Data

(63) Continuation of application No. PCT/JP2011/000584, filed on Feb. 2, 2011.

(30) Foreign Application Priority Data

Mar. 10, 2010  (JP) .................................. 2010-052775

(51) Int. Cl.
| | | |
|---|---|---|
| H01L 33/52 | (2010.01) | |
| H01L 33/44 | (2010.01) | |
| C04B 35/628 | (2006.01) | |
| C09K 11/02 | (2006.01) | |
| C04B 35/632 | (2006.01) | |
| C09K 11/08 | (2006.01) | |
| H01L 33/50 | (2010.01) | |
| H01L 33/56 | (2010.01) | |

(52) U.S. Cl.
CPC ........ *H01L 33/501* (2013.01); *C04B 35/62815* (2013.01); *C04B 2235/3427* (2013.01); *C09K 11/025* (2013.01); *H01L 2933/0041* (2013.01); *H01L 33/56* (2013.01); *C04B 35/6325* (2013.01); *C09K 11/08* (2013.01); *C04B 35/62886* (2013.01)
USPC .............................................. 257/98; 438/27

(58) Field of Classification Search
CPC .... C09K 11/025; C09K 11/08; H01L 33/501; H01L 33/56; H01L 2933/0041; C04B 35/62815; C04B 35/62886; C04B 35/6325; C04B 2235/3427
USPC ................ 257/98, E33.059, E33.061; 438/27
See application file for complete search history.

(56) References Cited

U.S. PATENT DOCUMENTS

| | | | |
|---|---|---|---|
| 4,025,485 A | 5/1977 | Kodama et al. | |
| 6,800,373 B2 * | 10/2004 | Gorczyca | ..................... 428/447 |

(Continued)

FOREIGN PATENT DOCUMENTS

| | | |
|---|---|---|
| JP | 52-014654 A | 2/1977 |
| JP | 08-134441 A | 5/1996 |

(Continued)

OTHER PUBLICATIONS

International Search Report for corresponding International Application No. PCT/JP2011/000584 mailed Mar. 15, 2011.

(Continued)

*Primary Examiner* — Walter H Swanson
(74) *Attorney, Agent, or Firm* — Renner, Otto, Boisselle & Sklar, LLP

(57) ABSTRACT

An LED encapsulation resin body disclosed in the present application includes: a phosphor; a heat resistance material arranged on, or in the vicinity of, a surface of the phosphor; and a silicone resin in which the phosphor with the heat resistance material arranged thereon is dispersed.

5 Claims, 4 Drawing Sheets

(56) References Cited

U.S. PATENT DOCUMENTS

| | | |
|---|---|---|
| 2003/0178632 A1* | 9/2003 | Hohn et al. .................... 257/99 |
| 2003/0227249 A1 | 12/2003 | Mueller et al. |
| 2005/0156496 A1 | 7/2005 | Takashima et al. |
| 2006/0001352 A1 | 1/2006 | Maruta et al. |
| 2006/0202105 A1 | 9/2006 | Krames et al. |
| 2007/0001585 A1 | 1/2007 | Hasegawa |
| 2008/0031009 A1* | 2/2008 | Kodaira et al. .............. 362/612 |
| 2009/0008673 A1 | 1/2009 | Kato et al. |
| 2009/0085464 A1* | 4/2009 | Oguma et al. ................ 313/503 |
| 2009/0194781 A1 | 8/2009 | Harada |
| 2009/0256166 A1 | 10/2009 | Koike et al. |
| 2011/0304261 A1* | 12/2011 | Winkler et al. .............. 313/503 |

FOREIGN PATENT DOCUMENTS

| | | |
|---|---|---|
| JP | 2000-021244 A | 1/2000 |
| JP | 2004-161807 A | 6/2004 |
| JP | 2005-302797 A | 10/2005 |
| JP | 2006-055768 A | 3/2006 |
| JP | 2006-127978 A | 5/2006 |
| JP | 2007-088299 A | 4/2007 |
| JP | 2007-157798 A | 6/2007 |
| JP | 2008-063446 A | 3/2008 |
| JP | 2009-024116 A | 2/2009 |
| JP | 2009-167338 A | 7/2009 |
| WO | 2007/018039 A1 | 2/2007 |
| WO | WO 2011/036447 A1 | 3/2011 |

OTHER PUBLICATIONS

Form PCT-ISA-237 for corresponding International Application No. PCT/JP2011/000584 dated Mar. 15, 2011 and partial English translation.

Notice of Reasons for Rejection mailed Jan. 17, 2012 for Japanese Application No. 2011-525323, which is a national phase application of PCT/JP2011/000584 and a full English translation.

Extended European Search Report for corresponding European Application No. 11752961.0 dated Sep. 24, 2013.

* cited by examiner

LED ENCAPSULATION RESIN BODY, LED DEVICE, AND METHOD FOR MANUFACTURING LED DEVICE

This is a continuation of International Application No. PCT/JP2011/00584, with an international filing date of Feb. 2, 2011, which claims priority of Japanese Patent Application No. 2010-052775, filed on Mar. 10, 2010, the contents of which are hereby incorporated by reference.

BACKGROUND

1. Technical Field

The present application relates to an LED encapsulation resin body for encapsulating an LED chip, an LED device using the same, and a method for manufacturing an LED device.

2. Description of the Related Art

In recent years, LEDs (Light Emitting Diodes) have been used for lighting, and there is a demand for the development of LEDs with higher brightness and longer lifetime. Semiconductor chips are normally encapsulated in a resin for protection. LED chips have also conventionally been encapsulated with an epoxy resin. As high-brightness LEDs have been put in practical use, silicone resins having higher heat resistance have been used as encapsulation materials.

However, even if LED chips are encapsulated with a silicone resin, the temperature of the LED chip and the silicone resin itself will increase particularly when a large current is conducted through high-brightness LED chips which have been put in practical use. Therefore, hardening deterioration progresses due to oxidation of the silicone resin, resulting in cracks. Moreover, where an LED chip encapsulated with a silicone resin is used outdoors, the silicone resin deteriorates due to ultraviolet rays, resulting in cracks.

Japanese Laid-Open Patent Publication Nos. 52-14654 and 2000-21244 (hereinafter, referred to as Patent Document Nos. 1 and 2, respectively) disclose adding/mixing a metal oxide such as cerium oxide, titanium oxide and iron oxide as a heat stabilizer in order to improve the heat resistance and the ultraviolet resistance of the silicone resin.

SUMMARY

One non-limiting, and exemplary embodiment provides an LED encapsulation resin body which has excellent heat resistance and is suitable as an encapsulation material of a light-emitting element, and an LED device and a method for manufacturing an LED device.

In one general aspect, an LED encapsulation resin body: a phosphor; a heat resistance material arranged on, or in the vicinity of, a surface of the phosphor; and a silicone resin in which the phosphor with the heat resistance material arranged thereon is dispersed.

An LED encapsulation resin mixture includes: an uncured silicone resin; a phosphor; and a heat resistance material arranged on, or in the vicinity of, a surface of the phosphor.

An LED device includes: a support; an LED chip supported by the support; and the LED encapsulation resin body set forth above arranged on the support so as to cover at least an exit surface of the LED chip.

With the LED encapsulation resin body and the LED encapsulation resin mixture, a phosphor carrying a heat resistance material thereon is dispersed in a silicone resin or an uncured silicone resin. Therefore, using the LED encapsulation resin body or the LED encapsulation resin mixture as an encapsulation material of an LED chip, the heat resistance and the ultraviolet resistance of the silicone resin are improved due to the heat resistance material. Since the heat resistance material is carried on the phosphor, it is possible to suppress a decrease in the efficiency at which light having exited from the LED chip exits to the outside of the LED encapsulation resin body. Thus, it is possible to realize an LED device having excellent heat resistance and ultraviolet resistance and high luminous efficiency.

A method for manufacturing an LED device includes the steps of: preparing a phosphor with a heat resistance material arranged on, or in the vicinity of, a surface thereof; mixing together the phosphor with the heat resistance material arranged thereon and an uncured silicone resin, thereby obtaining an uncured LED encapsulation resin mixture; and arranging the uncured LED encapsulation resin mixture on a support so as to cover at least an exit surface of an LED chip supported by the support, and curing the uncured LED encapsulation resin mixture.

Thus, it is possible to manufacture an LED device having excellent heat resistance and ultraviolet resistance and high luminous efficiency.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

DETAILED DESCRIPTION

Figure 1:
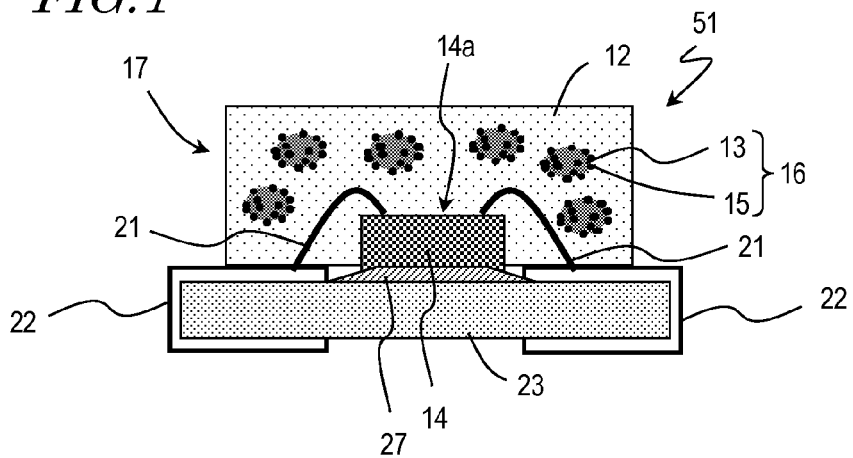
FIG. 1 is a schematic cross-sectional view showing one embodiment of an LED device.

Patent Document No. 1 discloses a silicone resin as an insulation material to be applied to a glass fiber product or used to impregnate a glass fiber product. Patent Document No. 2 discloses a silicone resin as a connector insulation member.

The present inventors produced a silicone resin and encapsulated LED chips therein according to methods disclosed in Patent Document No. 1 or 2, finding that the transparency of the silicone resin decreases and the visible light transmittance decreases. Moreover, from these reasons, the luminous efficiency as an LED device decreases. The inventors thus conceived a novel LED encapsulation resin body, a novel LED device, a novel LED encapsulation resin mixture and a novel method for manufacturing an LED device.

On exemplary embodiment of the present invention is as follows. An LED encapsulation resin body comprises: a phosphor; a heat resistance material arranged on, or in the vicinity of, a surface of the phosphor; and a silicone resin in which the phosphor with the heat resistance material arranged thereon is dispersed.

The heat resistance material may be cerium oxide.

The heat resistance material may be contained at a proportion of 0.005 part by weight or more and 0.1 part by weight or less with respect to 100 parts by weight of the silicone resin.

An LED device comprises: a support; an LED chip supported by the support; and an LED encapsulation resin body as defined in any one of the above-explained LED encapsulation resin body arranged on the support so as to cover at least an exit surface of the LED chip.

An LED encapsulation resin mixture comprises: an uncured silicone resin; a phosphor; and a heat resistance material arranged on, or in the vicinity of, a surface of the phosphor.

The heat resistance material is cerium oxide.

The heat resistance material is contained at a proportion of 0.005 part by weight or more and 0.1 part by weight or less with respect to 100 parts by weight of the silicone resin.

A method for manufacturing an LED device comprises the steps of: preparing a phosphor with a heat resistance material arranged on, or in the vicinity of, a surface thereof; mixing together the phosphor with the heat resistance material arranged thereon and an uncured silicone resin, thereby obtaining an uncured LED encapsulation resin mixture; and arranging the uncured LED encapsulation resin mixture on a support so as to cover at least an exit surface of an LED chip supported by the support, and curing the uncured LED encapsulation resin mixture.

The heat resistance material is cerium oxide.

The step of preparing a phosphor carrying a heat resistance material thereon includes the steps of: mixing together an organic metal complex of cerium and the phosphor in a solvent to obtain a mixture; and removing the solvent from the mixture and baking the mixture to obtain the phosphor carrying thereon the heat resistance material made of cerium oxide.

With the LED encapsulation resin body, a phosphor carrying a heat resistance material thereon is dispersed in a silicone resin. Therefore, using the LED encapsulation resin body as an encapsulation material of an LED chip, the heat resistance and the ultraviolet resistance of the silicone resin are improved due to the heat resistance material. Since the heat resistance material is carried on the phosphor, it is possible to suppress a decrease in the efficiency at which light having exited from the LED chip exits to the outside of the LED encapsulation resin body. Thus, it is possible to realize an LED device having excellent heat resistance and ultraviolet resistance and high luminous efficiency.

An embodiment of an LED encapsulation resin body, an LED device and a method for manufacturing an LED device will now be described.

FIG. 1 is a schematic cross-sectional view showing one embodiment of an LED device. As shown in FIG. 1, an LED device 51 includes a support 23, an LED chip 14, and an LED encapsulation resin body 17.

The support 23 supports the LED chip 14. In the present embodiment, since the LED device 51 has a structure capable of surface-mounting, the support 23 is a substrate. Since the present embodiment is suitably used in high-brightness LED devices, the support 23 may have a high thermal conductivity so that heat generated in an LED chip can be released efficiently. For example, a ceramic substrate made of alumina, aluminum nitride, or the like, can be suitably used as the support 23.

There is no particular limitation on the LED chip 14, and any of LED chips emitting light of various wavelengths may be used as the LED chip 14. Specifically, a blue LED chip, a purple LED chip, a red LED chip, a green LED chip, or the like, may be used as the LED chip 14. The LED chip 14 is secured to the support 23 by a solder 27, or the like, so that an exit surface 14a is facing up on the support 23. The LED chip 14 is electrically connected to an electrode 22 provided on the support by a bonding wire 21.

The LED encapsulation resin body 17 of the present embodiment includes a silicone resin 12, a phosphor 13, and a heat resistance material 15.

The silicone resin 12 may be a silicone resin having any of structures defined by various chemical formulae used as encapsulation resins of semiconductor light-emitting elements. Particularly, dimethyl silicone, which has a high color fastness, may be contained. Methylphenyl silicone, or the like, which has a high heat resistance, is also suitably used as the silicone resin 12. The silicone resin 12 may be a polymer having a main skeleton formed by a siloxane bond defined by a single chemical formula, or a copolymer or an alloy of two or more polymers. In the present specification, the silicone resin 12 in the LED encapsulation resin body 17 is in a cured state. Therefore, the LED encapsulation resin body 17 is also in a cured state. As will be described below, the LED encapsulation resin body 17 can be produced using an uncured silicone resin. A silicone resin is typically of a two-part type in which curing is facilitated by mixing together a main agent and a curing agent. However, a thermosetting silicone resin or an energy-curing silicone resin, which cures by being irradiated with an energy such as light, may be used as the silicone resin 12.

The phosphor 13 absorbs some or all of wavelength components of light emitted from the LED chip 14, and emits fluorescence. The wavelength(s) of light to be absorbed and the wavelength of the fluorescence are dictated by the phosphor contained in the phosphor 13. For example, a blue LED chip or a purple LED chip may be used as the LED chip 14, and a yttrium, aluminum, garnet-based YAG phosphor may be used as the phosphor 13. In such a case, the phosphor 13 absorbs some of blue light or purple light emitted from the LED chip 14, and emits fluorescence from red to green. Thus, blue light or purple light not absorbed by the phosphor 13 is mixed with fluorescence from red to green emitted from the phosphor 13, thus emitting white light from the LED device 51.

Other than the YAG phosphor, the phosphor 13 may be, for example, a strontium barium silicate-based phosphor, a ZnS-based phosphor, a $Y_2O_3$-based phosphor, a phosphor using a nitride or an oxynitride, a red light-emitting phosphor, a blue light-emitting phosphor, a green light-emitting phosphor, etc. The size of the phosphor may be 1 micron to 30 microns. The phosphor 13 may be contained in the LED encapsulation resin body 17 at a proportion of 3 parts by weight or more and 50 parts by weight or less with respect to 100 parts by weight of a silicone resin.

When the content of the phosphor 13 is less than 3 parts by weight, a sufficient intensity of fluorescence cannot be obtained, and it may not be possible to realize the LED device 51 emitting light of an intended wavelength. When the content of the phosphor 13 is greater than 50 parts by weight, the amount of light that is transmitted without being absorbed by the phosphor, of all the light emitted from the LED chip, decreases, whereby the transmitted light and the fluorescence mixed together may possibly not result in white light.

The heat resistance material 15 suppresses deterioration of the silicone resin 12 due to heat and ultraviolet rays released from the LED chip 14. It may contain at least one selected from the group consisting of cerium oxide, titanium oxide and iron oxide as the heat resistance material 15, and may be made of cerium oxide having a high heat resistance and ultraviolet resistance effect.

It is believed that the reason why a heat resistance material such as cerium oxide improves the heat resistance and the ultraviolet resistance of a silicone resin is as follows: (i) free radicals, which may lead to an oxidation reaction of the silicone resin 12, are generated in the silicone resin 12 through ultraviolet irradiation, and (ii) cerium ion in cerium oxide (metal ion in the heat resistance material) reacts with such radicals, thereby reducing itself and rendering the radicals harmless, thus suppressing hardening deterioration due to oxidation of silicone.

In the LED encapsulation resin body 17, a heat resistance material 15 is carried on particles of the phosphor 13, and the phosphor 13 carrying the heat resistance material 15 thereon is dispersed in the silicone resin 12. The heat resistance material 15 is located on, or in the vicinity of, the surface of the particles of the phosphor 13. As will be described in detail in the following examples, the heat resistance and ultraviolet resistance effects can be obtained as long as the heat resistance material 15 is contained in the LED encapsulation resin body 17. However, in-depth study by the present inventors revealed that where the heat resistance material 15 is dispersed, independent of the phosphor, in the silicone resin 12, the brightness of light emitted from the LED device 51 decreases. It was also revealed that this brightness decrease can be suppressed by having the heat resistance material 15 carried on the phosphor 13, and dispersing the phosphor 13, carrying the heat resistance material 15 thereon, in the silicone resin 12. It is believed that this is because if the heat resistance material 15 is dispersed, independent of the phosphor 13, in the silicone resin 12, fluorescence emitted from the phosphor 13 and light that has been emitted from the LED chip 14 and has not been incident upon the phosphor 13 are likely to be incident upon the heat resistance material 15 to be absorbed.

The heat resistance material 15, while being carried on the phosphor 13, may be contained in the LED encapsulation resin body 17 at a proportion of 0.005 part by weight or more and 0.1 part by weight or less with respect to 100 parts by weight of a silicone resin. If the content of the heat resistance material 15 is less than 0.005 part by weight, the heat resistance and ultraviolet resistance effects may not be obtained sufficiently. As the content of the heat resistance material 15 is larger, the oxidation resistance, the heat resistance and the ultraviolet resistance of the silicone resin improve. However, if the content of the heat resistance material 15 is greater than 0.1 part by weight, the intensity of light emitted from the LED device 51, i.e., the light-emitting intensity of the LED device 51, will decrease.

The LED encapsulation resin body 17 may contain other additives. For example, an additive whose refractive index is not so different from that of the silicone resin and which does not decrease the light-emitting intensity so much, e.g., fine silica particles whose specific surface as determined by the BET method is about 130 m$^2$/g or more, may be mixed. Such fine silica particles have an advantageous effect of suppressing sedimentation of the phosphor in the LED encapsulation resin body.

With the LED encapsulation resin body of the present embodiment, a phosphor carrying a heat resistance material thereon is dispersed in a silicone resin. Therefore, using the LED encapsulation resin body as an encapsulation material of an LED chip, the heat resistance and the ultraviolet resistance of the silicone resin are improved due to the heat resistance material. Since the heat resistance material is carried on the phosphor, it is possible to suppress a decrease in the efficiency at which light having exited from the LED chip exits to the outside of the LED encapsulation resin body. Thus, it is possible to realize an LED device having excellent heat resistance and ultraviolet resistance and high luminous efficiency.

Next, a method for manufacturing an LED device will be described.

First, an uncured LED encapsulation resin mixture is produced. An uncured LED encapsulation resin mixture is obtained through a step of preparing a phosphor carrying a heat resistance material thereon, and a step of mixing together the phosphor carrying the heat resistance material thereon and an uncured silicone resin. A phosphor carrying a heat resistance material thereon can be formed by any of various methods, e.g., a physical vapor deposition method such as ion plating may be used, or a heat resistance material may be made to be carried on a phosphor by a carrying method using gas diffusion. A phosphor carrying a heat resistance material thereon may be formed by dissolving a complex of a metal of the heat resistance material in a solvent, mixing it with the phosphor, removing the solvent, and then baking it with the metal complex carried on the phosphor, thereby oxidizing the metal. This method may be suitable because the heat resistance material can be evenly carried on the surface of the phosphor. A method for producing an uncured LED encapsulation resin body using cerium oxide as a heat resistance material will now be described in greater detail.

Figure 2A:
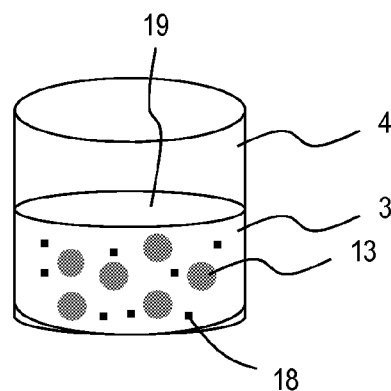
FIGS. 2A to 2D are diagrams showing steps for manufacturing an uncured LED encapsulation resin mixture.

As shown in FIG. 2A, a solvent 3 is poured into a container 4, and a cerium complex 18 and the phosphor 13 are added and mixed by stirring, thereby obtaining a mixture 19. The cerium complex 18 may be dissolved in the solvent 3, whereby the cerium complex 18 can be more evenly carried on the surface of the phosphor 13. Therefore, the cerium complex 18 may be an organic metal complex. The solvent 3 may be a nonaqueous solvent. For example, a cerium acetylacetonate complex (cerium acetoacetyl complex), an ethylenediaminetetraacetic acid cerium complex, and the like, can be used. The solvent 3 may be an alcohol such as ethanol, a ketone solvent such as methylethyl ketone, and the like.

Figure 2B:
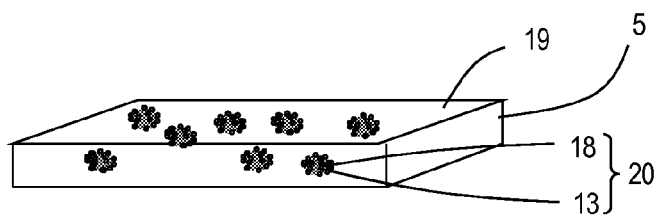

Next, the solvent 3 is removed from the mixture 19. For example, as shown in FIG. 2B, the mixture 19 may be moved into a tray 5, and the mixture 19 may be left in the air and dried naturally or the tray 5 may be heated so as to remove the solvent 3. Thus, a composite 20 in which the cerium complex 18 is carried on the phosphor 13 is obtained.

Figure 2C:
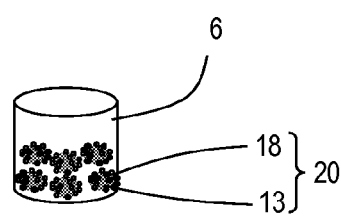

Next, as shown in FIG. 2C, the composite 20 is heated so as to remove the ligand of the cerium complex 18 and oxidize cerium. For example, the composite 20 is put into a crucible 6 and heated at a high temperature. Thus, the ligand of the cerium complex 18 is evaporated or decomposed and cerium is oxidized, thereby obtaining the phosphor 13 carrying thereon a heat resistance material made of cerium oxide. The composite 20 may be heated at a sufficiently high temperature so that the removal of the ligand and oxidization of cerium are done sufficiently. Where a cerium acetylacetonate complex is used, heating may be done at a temperature in the range of 500° C. or more and 700° C. or less, for example. Thus, a composite phosphor 16 is obtained, in which the heat resistance material 15 is carried on the surface of the phosphor 13.

Figure 2D:
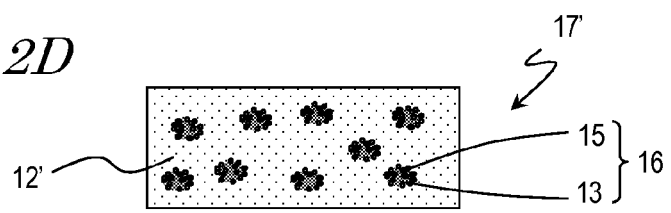

Then, as shown in FIG. 2D, the phosphor 13 (the composite phosphor 16) carrying the heat resistance material 15 thereon is dispersed in an uncured silicone resin 12', thereby obtaining an uncured LED encapsulation resin mixture 17'. In this process, where the silicone resin used is of a type that is hardened by mixing together two solutions, the uncured silicone resin 12' contains the A liquid and the B liquid.

Figure 3A:
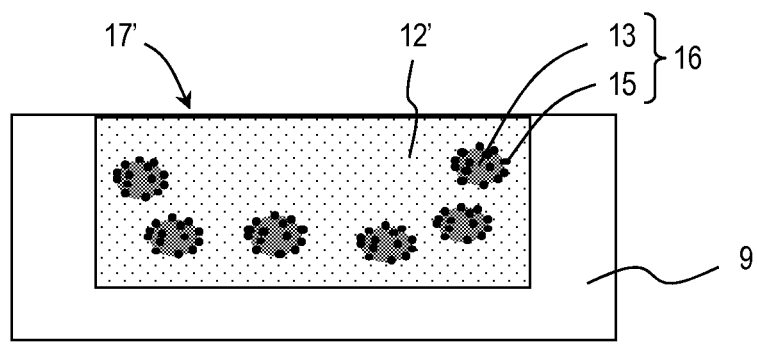
FIGS. 3A to 3C are diagrams showing steps for manufacturing the LED device shown in FIG. 1.
Figure 3B:
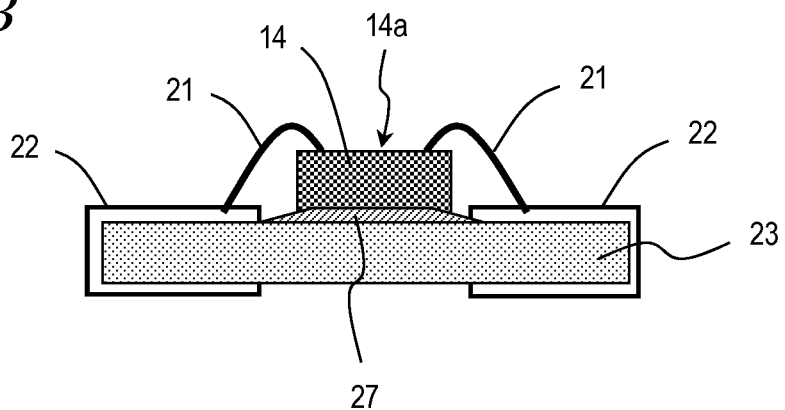
Figure 3C:
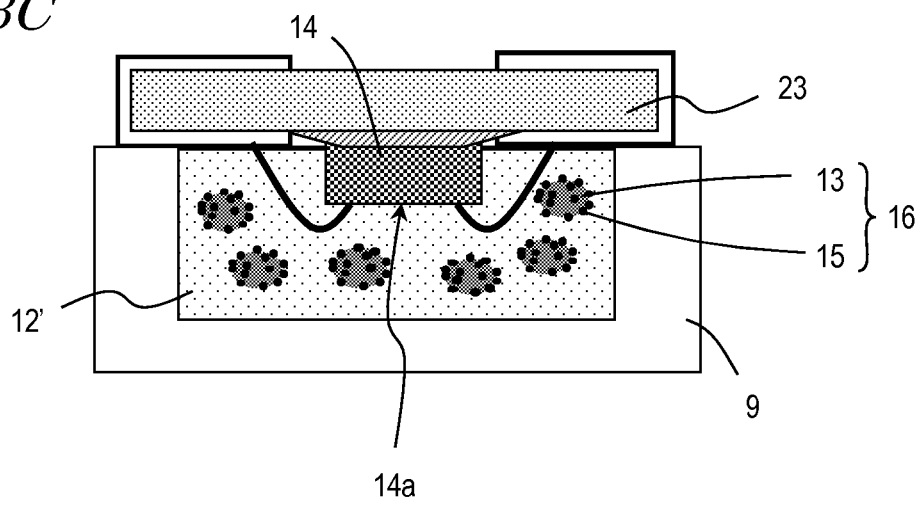

Next, as shown in FIG. 3A, a mold 9 having a desired shape is filled with the uncured LED encapsulation resin mixture 17'. Where foam, or the like, has been formed in the uncured LED encapsulation resin mixture 17', it is defoamed through a vacuum defoaming device, or the like, as necessary. Separately, an LED chip is supported on a support. As shown in FIG. 3B, the LED chip 14 is secured to the support 23 with the solder 27 so that the exit surface 14a is facing up, and the electrode 22 and the LED chip 14 are connected to each other by the bonding wire 21. Then, the support 23 is arranged with respect to the mold 9 so that the LED chip 14 is buried in the uncured LED encapsulation resin mixture 17' inside the mold 9, and the LED encapsulation resin mixture 17' is cured. For example, the LED encapsulation resin mixture 17' is heated and semi-cured with the mold 9 on as shown in FIG. 3C, and then the mold 9 is removed and the LED encapsulation resin mixture 17' is further cured. Then, the LED device 51 is completed, in which at least the exit surface 14a of the LED chip 14 is covered with the LED encapsulation resin body 17 as shown in FIG. 1.

Figure 4:
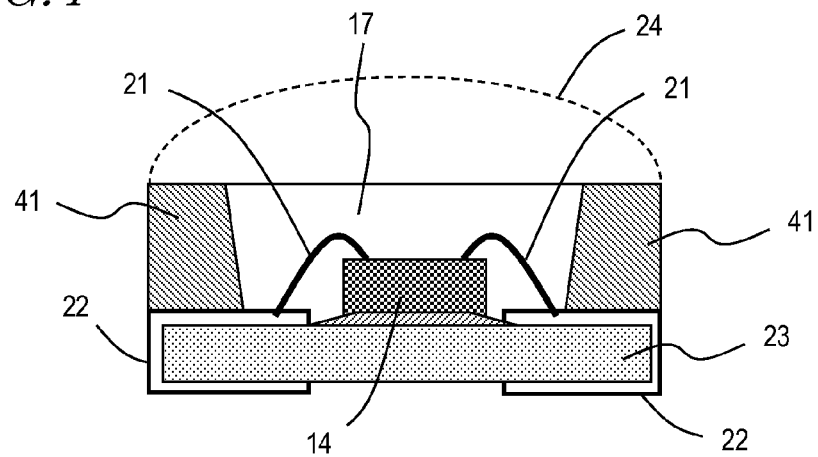
FIG. 4 is a schematic cross-sectional view showing another embodiment of an LED device.

Note that the structure of the LED device 51 described in the above embodiment is an example. An LED device of the present embodiment may have a structure other than that shown in FIG. 1. For example, as shown in FIG. 4, in addition to the structure shown in FIG. 1, the LED device may include a reflection mirror 41 provided around the LED chip 14 so that light exits from the LED chip 14 in a predetermined condensed state. A transparent resin 24 having a lens function for adjusting the condensed state of the output light may be provided on the surface of the LED encapsulation resin body 17.

Figure 5:
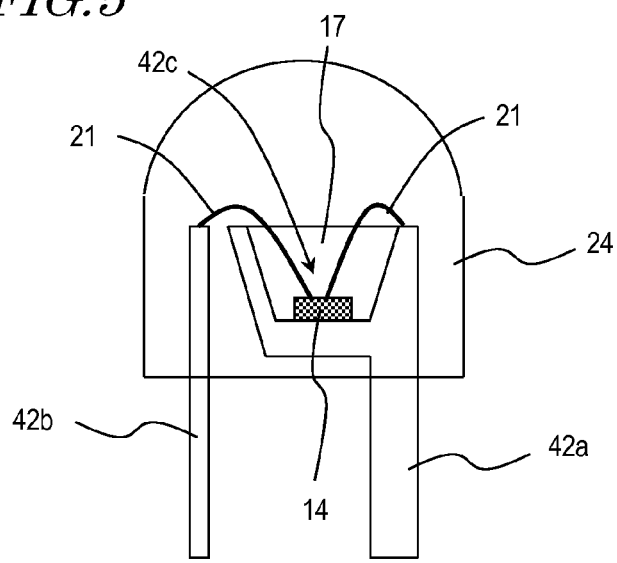
FIG. 5 is a schematic cross-sectional view showing another embodiment of an LED device.

In the LED device of the above embodiment, the LED chip 14 is supported by a substrate-like support. However, an LED device of the present embodiment may be an LED device in which an LED chip is supported by a leadframe. Specifically, an LED device shown in FIG. 5 includes a leadframe 42a, which is a support with a depressed portion 42c, and a leadframe 42b. The LED chip 14 is secured to the bottom portion of the depressed portion 42c of the leadframe 42a. The side surface of the depressed portion 42c functions as a reflection mirror. The LED encapsulation resin body 17 is provided so as to fill the depressed portion 42c. The LED chip 14 is electrically connected to the leadframes 42a and 42b with the bonding wire 21. Moreover, the entire upper portion of the leadframe 42a including the depressed portion 42c is encapsulated by the transparent resin 24 having a bullet-like shape.

Also with such an LED device, since the heat resistance and the ultraviolet resistance of the silicone resin are enhanced by the heat resistance material and the heat resistance material is carried on the phosphor, it is possible to suppress a decrease in the efficiency at which light having exited from the LED chip exits to the outside of the LED encapsulation resin body, as described above. Thus, it is possible to realize an LED device having excellent heat resistance and ultraviolet resistance and high luminous efficiency.

EXAMPLES

A method for manufacturing an LED encapsulation resin body and a method for manufacturing an LED device using the LED encapsulation resin body will now be described in detail. The ultraviolet resistance characteristics were evaluated for the LED encapsulation resin body, and the light-emitting intensity was evaluated for the LED device. The common evaluation method for evaluating samples will be described first.

(1) Samples of LED encapsulation resin bodies (vertical size and horizontal size: 10 mm×15 mm, thickness: 1 mm) were produced for the ultraviolet resistance evaluation. The LED encapsulation resin body samples were irradiated with ultraviolet rays by an ultraviolet irradiation device (luminous intensity: 50 mW/cm$^2$, cured object temperature: 140° C.), and the amount of time before cracks occurred was measured.

(2) LED devices were produced for measuring the light-emitting intensity. Each LED device includes a blue LED chip, and an LED encapsulation resin body having a phosphor. The LED chip was turned on so that the LED device emits light, and the light-emitting intensity of light in the wavelength region of 380 nm to 780 nm was measured.

Example 1

As shown in FIG. 2A, for 5 g of a strontium barium silicate-based phosphor as the phosphor 13, 1.7 g of cerium acetylacetonate (acetoacetyl) complex (cerium content: 0.15 wt %) as a metal complex 18 was put into the container (beaker) 4, and ethanol was added as the solvent 3, adjusting the entire volume to 40 ml. After the mixture 19 is stirred with a stirrer for 30 minutes, it was moved to the tray 5 and dried at 80° C. for 30 minutes, as shown in FIG. 2B. Then, as shown in FIG. 2C, the composite 20 obtained by drying was put into the crucible 6 and baked at 600° C. for 30 minutes, thereby obtaining the phosphor 13 (the composite phosphor 16) carrying cerium oxide thereon as the heat resistance material 15. The amount of cerium at this point was 0.05 wt % of the composite phosphor 16.

Next, 1.0005 g of the composite phosphor 16 was added to 5 g of the A component containing the main agent and the catalyst (hereinafter referred to as the A component) and 5 g of the B component containing the main agent and the curing agent (hereinafter referred to as the B component) of a dimethyl silicone resin (KER-2600 manufactured by Shin-Etsu Chemical Co., Ltd.), and passed through a three-roll kneader (M50 manufactured by EXAKT) three times, thereby obtaining the uncured LED encapsulation resin mixture 17' as shown in FIG. 2D. The amount of cerium was 0.005 part by weight with respect to 100 parts by weight of the silicone resin.

Then, the uncured LED encapsulation resin mixture 17' was put into a Teflon (registered trademark) petri dish, and cured at 150° C. for 4 hours, thereby obtaining an LED encapsulation resin body (thickness: 1 mm). An ultraviolet resistance evaluation for the obtained LED encapsulation resin body was performed.

As shown in FIG. 3A, the LED encapsulation resin mixture 17' was applied on the mold 9 made of SUS, and was defoamed by a vacuum defoaming device (manufactured by Nichiden Anelva Corporation) for 5 minutes, after which as shown in FIG. 3B, a blue LED chip (LXK2-PB14-N00 manufactured by Philips Lumileds Lighting Company) was attached, and wired, to the support 23. As shown in FIG. 3C, the support 23 was arranged with respect to the mold 9 so that the LED chip 14 was buried in the LED encapsulation resin mixture 17', and the LED encapsulation resin mixture 17' was semi-cured at 150° C. for 10 minutes. Then, the mold 9 was removed, and the LED encapsulation resin mixture 17' was further cured at 150° C. for 4 hours with the blue LED chip 14 arranged on the support 23 being covered by the LED encapsulation resin mixture 17', thereby completing the LED device shown in FIG. 1. The light-emitting intensity of the LED device was measured. The results are shown in Table 1.

Example 2

The phosphor 13 carrying the heat resistance material 15 thereon (the composite phosphor 16) was obtained by a similar method to that of Example 1, using 3.4 g of a cerium acetylacetonate complex (cerium content: 0.15 wt %) with respect to 5 g of a strontium barium silicate-based phosphor. The amount of cerium at this point was 0.1 wt % of the composite phosphor 16.

Moreover, an LED encapsulation resin body (thickness: 1 mm) was produced by a similar method while adding 1.001 g of the composite phosphor 16 to 5 g of the A component and 5 g of the B component of a dimethyl silicone resin (KER-2600 manufactured by Shin-Etsu Chemical Co., Ltd.), and the ultraviolet resistance evaluation for the LED encapsulation resin body was performed. The amount of cerium at this point was 0.01 part by weight with respect to 100 parts by weight of the dimethyl silicone resin.

Moreover, using this LED encapsulation resin body, the LED device shown in FIG. 1 was completed by a method similar to that of Example 1, and the light-emitting intensity was measured. The results are shown in Table 1.

Example 3

The phosphor 13 carrying the heat resistance material 15 thereon (the composite phosphor 16) was obtained by a similar method to that of Example 1, using 17 g of a cerium acetylacetonate complex (cerium content: 0.15 wt %) with respect to 5 g of a strontium barium silicate-based phosphor. The amount of cerium at this point was 0.5 wt % of the composite phosphor 16.

Moreover, an LED encapsulation resin body (thickness: 1 mm) was produced by a similar method while adding 1.0005 g of the composite phosphor 16 to 5 g of the A component and 5 g of the B component of a dimethyl silicone resin (KER-2600 manufactured by Shin-Etsu Chemical Co., Ltd.), and the ultraviolet resistance evaluation for the LED encapsulation resin body was performed. The amount of cerium at this point was 0.05 part by weight with respect to 100 parts by weight of the dimethyl silicone resin.

Moreover, using this LED encapsulation resin body, the LED device shown in FIG. 1 was completed by a method similar to that of Example 1, and the light-emitting intensity was measured. The results are shown in Table 1.

Example 4

The phosphor 13 carrying the heat resistance material 15 thereon (the composite phosphor 16) was obtained by a similar method to that of Example 1, using 1.36 g of a cerium acetylacetonate complex (cerium content: 0.15 wt %) with respect to 20 g of a strontium barium silicate-based phosphor. The amount of cerium at this point was 0.01 wt % of the composite phosphor 16.

Moreover, an LED encapsulation resin body (thickness: 1 mm) was produced by a similar method while adding 10.0001 g of the composite phosphor 16 to 50 g of the A component and 50 g of the B component of a dimethyl silicone resin (KER-2600 manufactured by Shin-Etsu Chemical Co., Ltd.), and the ultraviolet resistance evaluation for the LED encapsulation resin body was performed. The amount of cerium at this point was 0.001 part by weight with respect to 100 parts by weight of the dimethyl silicone resin.

Moreover, using this LED encapsulation resin body, the LED device shown in FIG. 1 was completed by a method similar to that of Example 1, and the light-emitting intensity was measured. The results are shown in Table 1.

Example 5

The phosphor 13 carrying the heat resistance material 15 thereon (the composite phosphor 16) was obtained by a similar method to that of Example 1, except for adjusting the entire volume to 200 ml with ethanol, using 170 g of a cerium acetylacetonate complex (cerium content: 0.15 wt %) with respect to 5 g of a strontium barium silicate-based phosphor. The amount of cerium at this point was 5 wt % of the composite phosphor 16.

Moreover, an LED encapsulation resin body (thickness: 1 mm) was produced by a similar method while adding 1.05 g of the composite phosphor 16 to 5 g of the A component and 5 g of the B component of a dimethyl silicone resin (KER-2600 manufactured by Shin-Etsu Chemical Co., Ltd.), and the ultraviolet resistance evaluation for the LED encapsulation resin body was performed. The amount of cerium at this point was 0.5 part by weight with respect to 100 parts by weight of the dimethyl silicone resin.

Moreover, using this LED encapsulation resin body, the LED device shown in FIG. 1 was completed by a method similar to that of Example 1, and the light-emitting intensity was measured. The results are shown in Table 1.

Comparative Example 1

A silicone resin mixture was obtained by passing 1 g of a strontium barium silicate-based phosphor with respect to 5 g of the A component and 5 g of the B component of a dimethyl silicone resin (KER-2600 manufactured by Shin-Etsu Chemical Co., Ltd.) through a three-roll kneader (M50 manufactured by EXAKT) three times. Then, this silicone resin mixture was put into a Teflon (registered trademark) petri dish, and the silicone resin mixture was cured at 150° C. for 4 hours, thereby obtaining an LED encapsulation resin body (thickness: 1 mm). An ultraviolet resistance evaluation for the obtained LED encapsulation resin body was performed.

Figure 6:
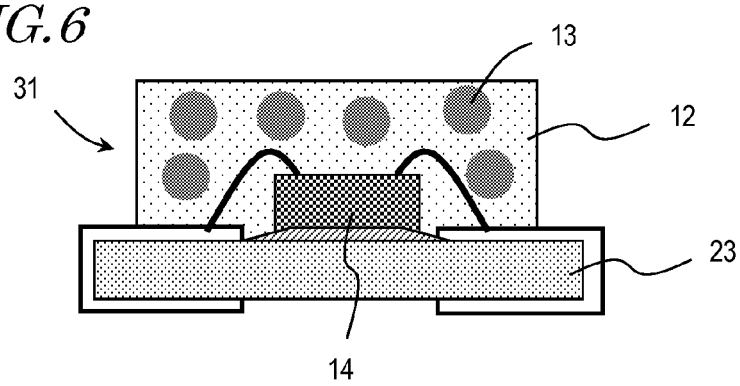
FIG. 6 is a schematic cross-sectional view showing an LED device according to Comparative Example 1.

An LED device was completed by a similar method to that of Example 1 using this silicone resin mixture, and the light-emitting intensity was measured. The results are shown in Table 1. Since no heat resistance material is carried on the phosphor, the produced LED device includes an LED encapsulation resin body 31 in which the phosphor 13 with no heat resistance material carried thereon is dispersed, as shown in FIG. 6.

Comparative Example 2

A silicone resin mixture was obtained by adding 1 g of a strontium barium silicate-based phosphor and 0.0005 g of a cerium oxide powder to 5 g of the A component and 5 g of the B component of a dimethyl silicone resin (KER-2600 manufactured by Shin-Etsu Chemical Co., Ltd.), and passing it through a three-roll kneader (M50 manufactured by EXAKT) three times. The amount of cerium was 0.005 part by weight with respect to 100 parts by weight of the silicone resin. Then, this silicone resin mixture was put into a Teflon (registered trademark) petri dish, and the silicone resin mixture was cured at 150° C. for 4 hours, thereby obtaining an LED encapsulation resin body (thickness: 1 mm). An ultraviolet resistance evaluation for the obtained LED encapsulation resin body was performed.

Figure 7:
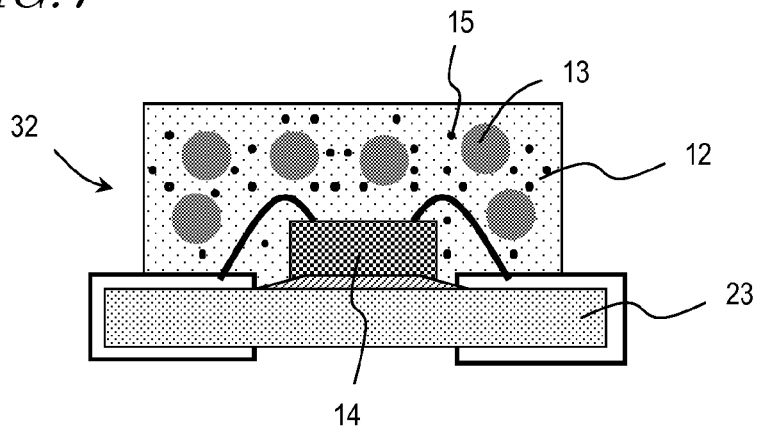
FIG. 7 is a schematic cross-sectional view showing an LED device according to Comparative Example 2 to 4.

An LED device was completed by a similar method to that of Example 1 using this silicone resin mixture, and the light-emitting intensity was measured. The results are shown in Table 1. As shown in FIG. 7, an LED encapsulation resin body 32 of the produced LED device contains the heat resistance material 15 and the phosphor 13. However, since the heat resistance material 15 is not provided in advance to be carried on the phosphor 13, the heat resistance material 15 and the phosphor 13 are independently dispersed in the LED encapsulation resin body 32.

Comparative Example 3

A silicone resin mixture was obtained by adding 1 g of a strontium barium silicate-based phosphor and 0.001 g of a cerium oxide powder to 5 g of the A component and 5 g of the B component to a dimethyl silicone resin (KER-2600 manufactured by Shin-Etsu Chemical Co., Ltd.) and passing it through a three-roll kneader (M50 manufactured by EXAKT) three times. The amount of cerium was 0.01 part by weight with respect to 100 parts by weight of the silicone resin. Then, this silicone resin mixture was put into a Teflon (registered trademark) petri dish, and the silicone resin mixture was cured at 150° C. for 4 hours, thereby obtaining an LED encapsulation resin body (thickness: 1 mm). An ultraviolet resistance evaluation for the obtained LED encapsulation resin body was performed.

An LED device was completed by a similar method to that of Example 1 using this silicone resin mixture, and the light-emitting intensity was measured. The results are shown in Table 1. As shown in FIG. 7, the LED encapsulation resin body 32 of the produced LED device contains the heat resistance material 15 and the phosphor 13. However, since the heat resistance material 15 is not provided in advance to be carried on the phosphor 13, the heat resistance material 15 and the phosphor 13 are independently dispersed in the LED encapsulation resin body 32.

Comparative Example 4

A silicone resin mixture was obtained by adding 1 g of a strontium barium silicate-based phosphor and 0.005 g of a cerium oxide powder to 5 g of the A component and 5 g of the B component of a dimethyl silicone resin (KER-2600 manufactured by Shin-Etsu Chemical Co., Ltd.), and passing it through a three-roll kneader (M50 manufactured by EXAKT) three times. The amount of cerium was 0.05 part by weight with respect to 100 parts by weight of the silicone resin. Then, this silicone resin mixture was put into a Teflon (registered trademark) petri dish, and the silicone resin mixture was cured at 150° C. for 4 hours, thereby obtaining an LED encapsulation resin body (thickness: 1 mm). An ultraviolet resistance evaluation for the obtained LED encapsulation resin body was performed.

An LED device was completed by a similar method to that of Example 1 using this silicone resin mixture, and the light-emitting intensity was measured. The results are shown in Table 1. As shown in FIG. 7, the LED encapsulation resin body 32 of the produced LED device contains the heat resistance material 15 and the phosphor 13. However, since the heat resistance material 15 is not provided in advance to be carried on the phosphor 13, the heat resistance material 15 and the phosphor 13 are independently dispersed in the LED encapsulation resin body 32.

TABLE 1

| Samples | | Ultraviolet resistance evaluation | Light-emitting intensity |
|---|---|---|---|
| Example 4 | Silicone resin + phosphor powder carrying cerium oxide (cerium: 0.001 part by weight) | 910 hrs | 100 |
| Example 1 | Silicone resin + phosphor powder carrying cerium oxide (cerium: 0.005 part by weight) | 1050 hrs | 100 |
| Example 2 | Silicone resin + phosphor powder carrying cerium oxide (cerium: 0.01 part by weight) | 1050 hrs | 100 |
| Example 3 | Silicone resin + phosphor powder carrying cerium oxide (cerium: 0.05 part by weight) | 1220 hrs | 99 |
| Reference Example | Silicone resin + phosphor powder carrying cerium oxide (cerium: 0.5 part by weight) | 1500 hrs | 92 |
| Comparative Example 1 | Silicone resin + phosphor | 900 hrs | 100 (reference) |
| Comparative Example 2 | Silicone resin + phosphor + cerium oxide (cerium: 0.005 part by weight) | 1100 hrs | 96 |
| Comparative Example 3 | Silicone resin + phosphor + cerium oxide (cerium: 0.01 part by weight) | 1100 hrs | 96 |
| Comparative Example 4 | Silicone resin + phosphor + cerium oxide (cerium: 0.05 part by weight) | 1250 hrs | 95 |

The obtained results are all shown in Table 1. In Table 1, Examples and Comparative Examples are shown in the order of cerium content for the sake of simplicity. The light-emitting intensities of the samples are shown with reference to the light-emitting intensity obtained by measuring the sample of Comparative Example 1 being 100.

As shown in Table 1, the LED encapsulation resin body of Comparative Example 1, in which only a phosphor was dispersed in a silicone resin, had cracks after 900 hours in the ultraviolet resistance evaluation. The LED encapsulation resin body of Comparative Example 4, in which a phosphor and 0.05 part by weight of a cerium oxide powder are dispersed in a silicone resin, does not have cracks over 1200 hours or more in the ultraviolet resistance evaluation. However, with the light-emitting intensity of the LED device of Comparative Example 1 being 100, the light-emitting intensity of the LED device of Comparative Example 4 is 95, indicating a decrease in the light-emitting intensity.

The LED encapsulation resin bodies of Comparative Examples 2 and 3, in which a phosphor and 0.005 part by weight and 0.01 part by weight of a cerium oxide powder are dispersed in a silicone resin, do not have cracks over 1100 hours or more in the ultraviolet resistance evaluation. However, with the light-emitting intensity of the LED device of Comparative Example 1 being 100, the light-emitting intensities of the LED devices of Comparative Examples 2 and 3 are both 96, indicating a decrease in the light-emitting intensity.

On the other hand, the LED encapsulation resin bodies of Examples 1 to 3, in which a phosphor carrying cerium oxide thereon is dispersed, do not have cracks over 1050 hours or more in the ultraviolet resistance evaluation. The light-emitting intensities of the LED devices of Examples 1 to 3 are greater than the LED devices of Comparative Example 2 to 4, and are at least 99 or more with the light-emitting intensity of the LED device of Comparative Example 1 being 100.

The LED encapsulation resin body of Example 4 has cracks after 910 hours in the ultraviolet resistance evaluation because the cerium oxide content is small. However, since the length of time before cracks occur is extended as compared with Comparative Example 1, it can be said that the ultraviolet resistance is improved. The light-emitting intensity of the LED device of Example 4 is equal to that of Comparative Example 1.

The LED encapsulation resin body of Example 5 in which the amount of cerium is 0.5 part by weight does not have cracks over 1500 hours or more in the ultraviolet resistance evaluation. However, the light-emitting intensity of the LED device was 92, indicating a decrease in the light-emitting intensity.

Figure 8:
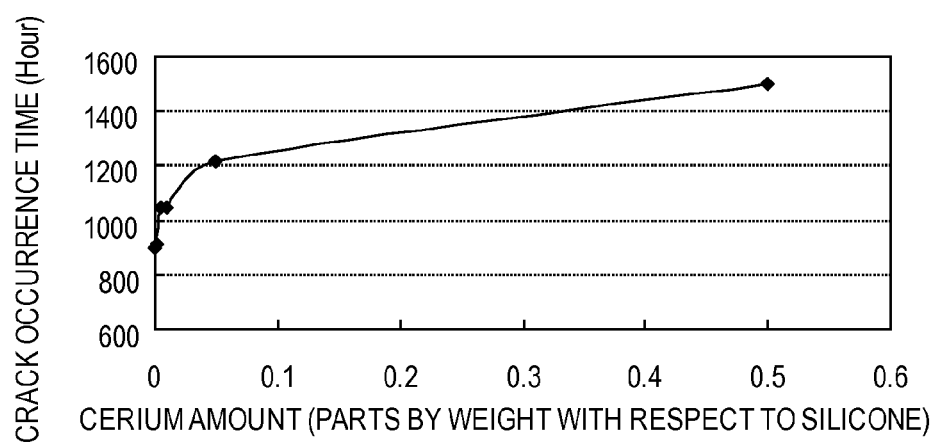
FIG. 8 is a graph showing a relationship between the crack occurrence time and the cerium oxide content for LED devices of Examples 1 to 5.
Figure 9:
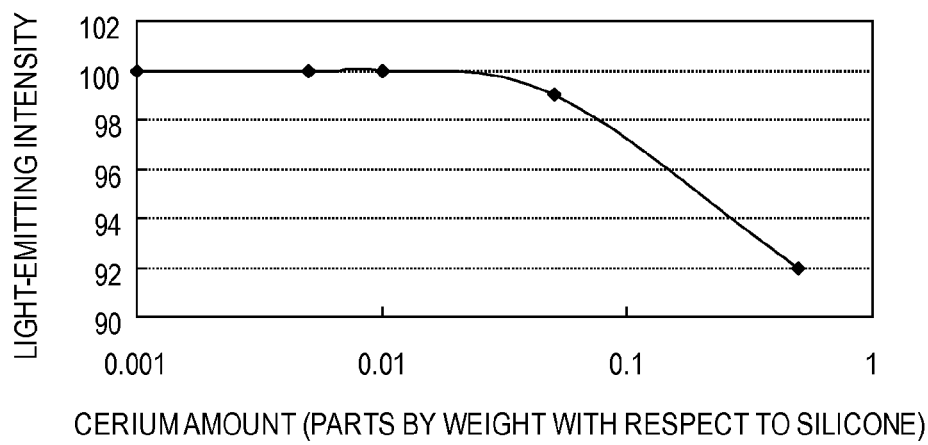
FIG. 9 is a graph showing the relationship between the light-emitting intensity and the cerium oxide content for LED devices of Examples 1 to 5.

FIGS. 8 and 9 are graphs showing the relationship between the crack occurrence time and the amount of cerium and the relationship between the light-emitting intensity and the amount of cerium, respectively, for Examples 1 to 4 and Reference Example.

From these results, where a phosphor carrying cerium oxide thereon is dispersed in a silicone resin, it can be said that the heat resistance and the ultraviolet resistance are improved if any cerium oxide is contained therein. It can also be said that if the cerium oxide content is 0.05 part by weight or more, there are obtained significant effects that the crack occurrence time can be extended to 1000 hours or more and the heat resistance and the ultraviolet resistance are improved by ten percent as compared with Comparative Example 1.

On the other hand, from FIG. 9, the light-emitting intensity of the LED device decreases as the cerium oxide content is larger. It is believed that this is because the proportion of the phosphor surface covered by cerium oxide, which does not substantially contribute to the fluorescence emission, increases. That is, there is a trade-off relationship between improving the heat resistance and the ultraviolet resistance and maintaining the light-emitting intensity. Therefore, if it is desired to improve the heat resistance and the ultraviolet resistance despite some decrease in the light-emitting intensity, it is meaningful to increase the cerium oxide content so as to improve the heat resistance and the ultraviolet resistance of the LED device within such a range that the light-emitting intensity does not decrease significantly, thereby prolonging the lifetime of the LED device. For example, although the light-emitting intensity of the LED device of Example 5 decreases by about 8% as compared with Comparative Example 1, the heat resistance and the ultraviolet resistance are improved by 1.5 times or more. Thus, by setting the cerium oxide content to 0.5 part by weight, it is possible to significantly prolong the lifetime of the LED device.

As long as the light-emitting intensity is about 97 with respect to that of the LED device of Comparative Example 1, i.e., the decrease in the light-emitting intensity is about 3% as compared with a case where no heat resistance material is added, the decrease in the light-emitting intensity is practically substantially inconspicuous. In such a case, the cerium oxide content may be 0.1 part by weight or less with respect to 100 parts by weight of the silicone resin. That is, it can be seen that the cerium oxide content may be 0.005 part by weight or more and 0.1 part by weight or less with respect to 100 parts by weight of the silicone resin so that the light-emitting intensity can be substantially maintained and so as to significantly realize the effect of improving the heat resistance and the ultraviolet resistance.

The LED encapsulation resin body and the LED device of the present embodiment can be suitably used in LED devices emitting light of various wavelengths, and are particularly suitably used in high-brightness LED devices.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. An LED encapsulation resin body comprising:
    a phosphor;
    a heat resistance material arranged on, or in the vicinity of, a surface of the phosphor; and
    a silicone resin in which the phosphor with the heat resistance material arranged thereon is dispersed,
    wherein the heat resistance material contains at least one selected from the group consisting of cerium oxide, titanium oxide and iron oxide, and the heat resistance material is contained at a proportion of 0.005 part by weight or more and 0.1 part by weight or less with respect to 100 parts by weight of the silicone resin.

2. The LED encapsulation resin body according to claim 1, wherein the heat resistance material is cerium oxide.

3. An LED device comprising:
    a support;
    an LED chip supported by the support; and
    the LED encapsulation resin body as defined in claim 1 arranged on the support so as to cover at least an exit surface of the LED chip.

4. An LED encapsulation resin mixture comprising:
    an uncured silicone resin;
    a phosphor; and
    a heat resistance material arranged on, or in the vicinity of, a surface of the phosphor,
    wherein the heat resistance material contains at least one selected from the group consisting of cerium oxide, titanium oxide and iron oxide, and the heat resistance material is contained at a proportion of 0.005 part by weight or more and 0.1 part by weight or less with respect to 100 parts by weight of the silicone resin.

5. The LED encapsulation resin mixture according to claim 4, wherein the heat resistance material is cerium oxide.

* * * * *